(12) United States Patent
Choi et al.

(10) Patent No.: US 11,233,213 B2
(45) Date of Patent: Jan. 25, 2022

(54) ORGANIC LIGHT EMITTING DISPLAY DEVICE

(71) Applicant: SAMSUNG DISPLAY CO., LTD., Yongin-si (KR)

(72) Inventors: Sang Hyun Choi, Yongin-si (KR); Young Nam Yun, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/825,014

(22) Filed: Mar. 20, 2020

(65) Prior Publication Data

US 2020/0220095 A1 Jul. 9, 2020

Related U.S. Application Data

(63) Continuation of application No. 15/847,077, filed on Dec. 19, 2017, now Pat. No. 10,622,577, which is a
(Continued)

(30) Foreign Application Priority Data

Jun. 9, 2014 (KR) .................. 10-2014-0069418

(51) Int. Cl.
*H01L 51/50* (2006.01)
*H01L 27/32* (2006.01)
*H01L 51/52* (2006.01)

(52) U.S. Cl.
CPC ...... *H01L 51/5036* (2013.01); *H01L 27/3209* (2013.01); *H01L 27/3211* (2013.01); *H01L 51/5265* (2013.01)

(58) Field of Classification Search
CPC ............ H01L 51/5036; H01L 27/3209; H01L 27/3211; H01L 51/5265
See application file for complete search history.

(56) References Cited

U.S. PATENT DOCUMENTS 7,659,664 B2 2/2010 Nshikawa et al.
8,957,442 B2 2/2015 Seo et al.
(Continued)

FOREIGN PATENT DOCUMENTS

JP 2007-103358 A 4/2007
KR 10-2007-0056469 A 6/2007
(Continued)

OTHER PUBLICATIONS

Lee, Min Woo, et al., Asymmetric High Performance Hybrid Tandem White OLEDs for Lighting Applications, SID 10 Digest, pp. 1800-1803, OLED R&D Center, Samsung Mobile Display Co., Ltd., Giheung-Gu, Yongin-City, Gyeonggi-Do, Korea (2010).

*Primary Examiner* — Shahed Ahmed
*Assistant Examiner* — Vicki B. Booker
(74) *Attorney, Agent, or Firm* — Lewis Roca Rothgerber Christie LLP

(57) ABSTRACT

An organic light emitting display device includes a substrate with a first emitting region adjacent a second emitting region, a first anode in the first emitting region, a first organic light emitting layer on the first anode, a second anode in the second emitting region, and a second organic light emitting layer on a part of the first anode and the second anode. The second organic light emitting layer includes a material different from the first organic light emitting layer.

5 Claims, 13 Drawing Sheets

Related U.S. Application Data continuation of application No. 14/533,166, filed on Nov. 5, 2014, now Pat. No. 9,876,186.

(56) References Cited

U.S. PATENT DOCUMENTS

| | | | |
|---|---|---|---|
| 8,987,716 B2 | 3/2015 | Lee et al. | |
| 9,343,691 B2 * | 5/2016 | Seo | H01L 27/3211 |
| 2008/0284324 A1 | 11/2008 | Chun et al. | |
| 2011/0062475 A1 * | 3/2011 | Cho | H01L 51/5265 |
| | | | 257/98 |
| 2012/0223346 A1 * | 9/2012 | Ohsawa | H01L 27/322 |
| | | | 257/89 |
| 2013/0140533 A1 * | 6/2013 | Lee | H01L 27/3218 |
| | | | 257/40 |
| 2013/0146853 A1 | 6/2013 | Lee et al. | |

FOREIGN PATENT DOCUMENTS

| | | |
|---|---|---|
| KR | 10-2009-0131404 A | 12/2009 |
| KR | 10-2010-0041314 A | 4/2010 |
| KR | 10-2013-0064949 A | 6/2013 |
| KR | 10-2014-0013854 A | 2/2014 |

* cited by examiner

ORGANIC LIGHT EMITTING DISPLAY DEVICE

CROSS-REFERENCE TO RELATED APPLICATIONS

This application is a continuation of application Ser. No. 15/847,077, filed on Dec. 19, 2017, which is a continuation of application Ser. No. 14/533,166, filed Nov. 5, 2014, now U.S. Pat. No. 9,876,186, which claims priority to and the benefit of Korean Patent Application No. 10-2014-0069418, filed on Jun. 9, 2014, in the Korean Intellectual Property Office, the entire contents of which each of which is hereby incorporated by reference.

BACKGROUND

1. Field

One or more embodiments described herein relate to an organic light emitting display device.

2. Description of the Related Art

An organic light emitting display device includes organic layers between an anode and cathode. The organic layers include an emitting layer, a hole injecting layer, a hole transport layer, an electron transport layer, and an electron injecting layer. In operation, electrons and holes generated by the anode and the cathode recombine in the emitting layer to emit light.

In one type of organic light emitting display device, a plurality of emitting layers are included to emit light of different colors. For example, a first emitting layer emits light of a first color, a second emitting layer emits light of a second color, and a third emitting layer emits light of a third color. A particular color is emitted by combining the light of the first to third colors.

SUMMARY

In accordance with one embodiment, an organic light emitting display device includes a substrate with a first emitting region adjacent a second emitting region; a first anode in the first emitting region; a first organic light emitting layer on the first anode; a second anode in the second emitting region; and a second organic light emitting layer on a part of the first anode and the second anode, the second organic light emitting layer including a material different from the first organic light emitting layer.

A part of the second organic light emitting layer may be on an edge portion of the first anode that faces the second anode. The second organic light emitting layer may extend from an upper portion of the second anode to an upper edge portion of the first anode that faces the second anode. The first organic light emitting layer may not overlap the second organic light emitting layer.

The first organic light emitting layer may emit red light, and the second organic light emitting layer may emit green or blue light. The first organic light emitting layer may be in direct contact with the second organic light emitting layer on the first anode.

The substrate may include a third emitting region positioned on another side of the first emitting region, and the organic light emitting display device may include a third anode on the third emitting region, and a third organic light emitting layer on the another part of the first anode and the third anode, the third organic light emitting layer including a material different from the first organic light emitting layer and the second organic light emitting layer.

The third organic light emitting layer may be on an edge portion of the first anode that faces the third anode. The third organic light emitting layer may extend from an upper portion of the third anode to an upper edge portion of the first anode that faces the third anode. The first organic light emitting layer may not overlap the second organic light emitting layer and the third organic light emitting layer. The first organic light emitting layer may be in direct contact with the second organic light emitting layer and the third organic light emitting layer on the first anode.

The device may include a cathode over an entire surface of the substrate and facing the first anode and the second anode, wherein the first organic light emitting layer and the second organic light emitting layer are between the cathode and the first and second anodes.

In accordance with another embodiment, an organic light emitting display device includes a substrate with a first emitting region adjacent a second emitting region; a first anode in the first emitting region; a first organic light emitting layer on the first anode and including a first emitting material to emit a first color; a second organic light emitting layer on the first organic light emitting layer and including a second emitting material to emit light of a second color different from the first color; a second anode in the second emitting region; and a third organic light emitting layer on the second anode and including the second emitting material. The first color may be red and the second color may be green or blue.

The second organic light emitting layer may include a third emitting material to emit light of a third color different from the first color and the second color, the substrate includes a third emitting region on another side of the first emitting region, and the organic light emitting display device includes: a third anode in the third emitting region; and a fourth organic light emitting layer on the third anode and including the third emitting material.

The device may include a cathode over an entire surface of the substrate and facing the first anode and the second anode, wherein the first organic light emitting layer and the second organic light emitting layer are between the cathode and the first and second anodes.

In accordance with another embodiment, an organic light emitting display device includes a substrate with a first emitting region adjacent a second emitting region; a first anode in the first emitting region; a first organic light emitting layer on the first anode and including a first material to emit light of a first color and a second material to emit light of a second color; a second anode in the second emitting region; and a second organic light emitting layer on the second anode and including the second emitting material. The first color may be red and the second color may be green or blue.

The first organic light emitting layer may include a third emitting material to emit light of a third color different from the first color and the second color, the substrate may include a third emitting region on another side of the first emitting region, and the organic light emitting display device may include a third anode in the third emitting region; and a fourth organic light emitting layer on the third anode and including the third emitting material. The device may include a cathode over an entire surface of the substrate and facing the first anode and the second anode, wherein the first organic light emitting layer and the second organic light emitting layer are between the cathode and the first and second anodes.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
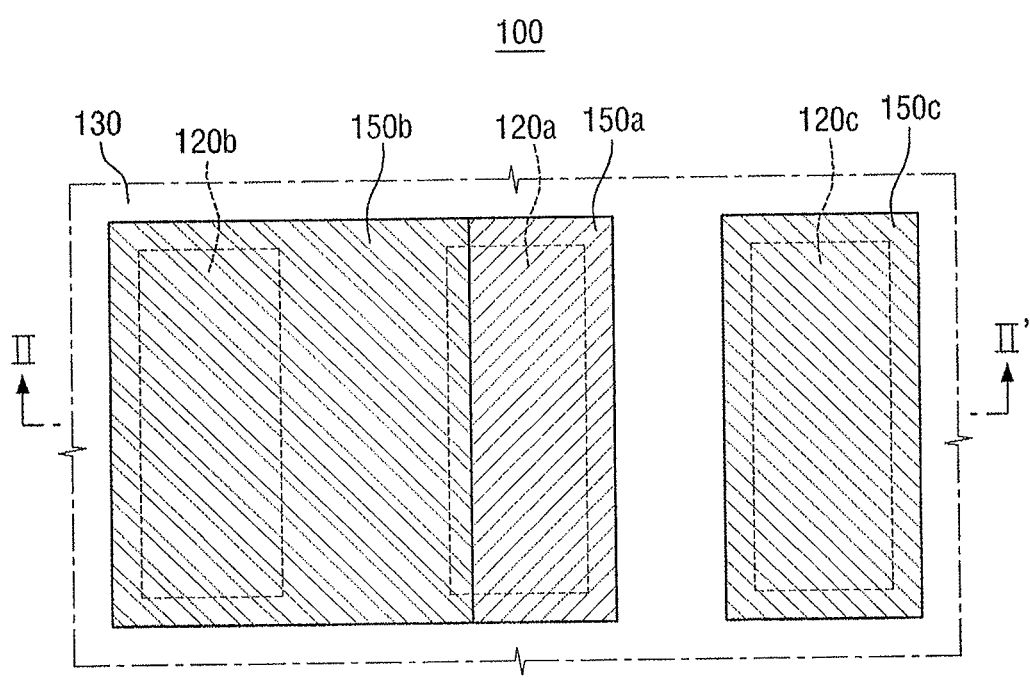
FIG. 1 illustrates an embodiment of an organic light emitting display device.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
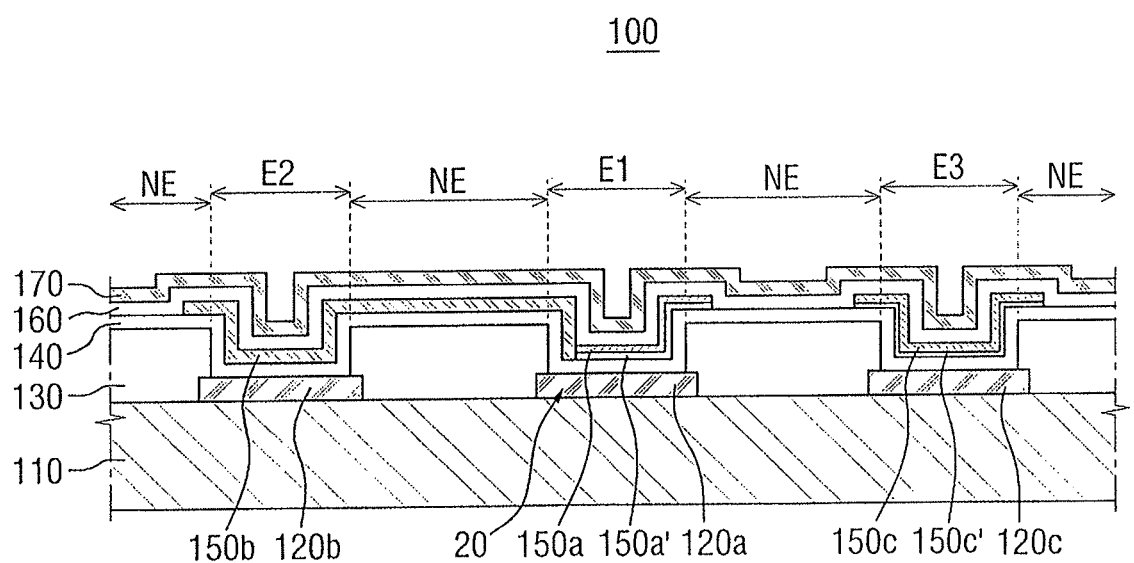
FIG. 2 illustrates a view along section line II-II' in FIG. 1.

FIG. 1 illustrates an embodiment of an organic light emitting display device 100, and FIG. 2 is a cross-sectional view taken along line II-II' in FIG. 1. Referring to FIGS. 1 and 2, the organic light emitting display device 100 includes a substrate 110, a plurality of anodes 120a, 120b, and 120c, a pixel defining layer 130, a hole transfer layer 140, a plurality of organic light emitting layers 150a, 150b, and 150c, a plurality of auxiliary layers 150a' and 150c', an electron transfer layer 160, and a cathode 170.

The substrate 110 may be or include an insulating substrate. The insulating substrate may be formed of a transparent glass material having, for example, transparent $SiO_2$ as a main component. In one embodiment, the insulating substrate may be made of an opaque material or a plastic material. Further, the insulating substrate may be a flexible substrate that may bend, fold, or be rolled.

The substrate 110 may further include other structures formed on the insulating substrate. Examples include but are not limited to wiring and an insulating layer. If the organic light emitting display device 100 is an active organic light emitting display device, the substrate 110 may include a plurality of thin film transistors on the insulating substrate. Each thin film transistor may include a gate electrode, a source electrode, a drain electrode, and a semiconductor layer including a channel region. The semiconductor layer may be formed, for example, of amorphous silicon, microcrystalline silicon, polycrystalline silicon, monocrystalline silicon, or oxide semiconductor. The drain electrodes of one or more of the thin film transistors may be electrically connected to the anodes 120a, 120b, and 120c.

The substrate 110 may include a plurality of emitting regions E1, E2, and E3, and a non-emitting region NE. The emitting regions E1, E2, and E3 emit light. The non-emitting region NE do not emit light. Further, the emitting regions E1, E2, and E3 include the anodes 120a, 120b, and 120, which are exposed by the pixel defining layer 130. The non-emitting region NE includes the pixel defining layer 130. The emitting regions E1, E2, and E3 may be formed to be spaced from each other. The non-emitting region NE may surround the emitting regions E1, E2, and E3. Further, the emitting regions E1, E2, and E3 may emit light having different colors.

The emitting regions E1, E2, and E3 include the first emitting region E1, the second emitting region E2, and the third emitting region E3. The first emitting region E1, the second emitting region E2, and the third emitting region E3 may correspond to a first pixel (or sub-pixel), a second pixel (or sub-pixel), and a third pixel (or sub-pixel), respectively. The sub-pixels may be included in a same pixel.

The first emitting region E1, the second emitting region E2, and the third emitting region E3 may emit a first, second, and third color light. The first, second, and the third color may be red, blue, and green, respectively. In another embodiment, one or more different color or white light may be emitted.

In this embodiment, the first emitting region E1 is between the second and third emitting regions E2 and E3. That is, the second and third emitting regions E2 and E3 are adjacent respective sides of the first emitting region E1. In the embodiment of FIG. 2, the second emitting region E2 is left of the first emitting region E1, and the third emitting region E3 is right of the first emitting region E1.

The anodes 120a, 120b, and 120c are on the substrate 110 and are spaced from each other. For example, the anodes 120a, 120b, and 120c may be positioned in respective ones of the emitting regions E1, E2, and E3. That is, the anodes 120a, 120b, and 120c are formed to be mutually separated from each other by pixels (or sub-pixels). The anodes 120a and 120b, and 120c may be independently driven, and may function to transfer holes to the hole transfer layer 140 and respective ones of the organic light emitting layers 150a, 150b, and 150c.

The anodes 120a, 120b, and 120c may be made of a conductive material having, for example, a high work function. If the organic light emitting display device 110 is a bottom emission-type display device, the anodes 120a, 120b, and 120c may be formed of a material including but not limited to ITO, IZO, ZnO, or $In_2O_3$, or a laminated layer thereof. If the organic light emitting display device 100 is a top emission-type display device, the anodes 120*a*, 120*b*, and 120*c* may further include a reflective layer, which is formed, for example, of Ag, Mg, Al, Pt, Pd, Au, Ni, Nd, Ir, Cr, Li, or Ca.

The anodes 120*a*, 120*b*, and 120*c* may be modified in various ways, for example, to have a structure of two or more layers using two or more different materials. The anodes 120*a*, 120*b*, and 120*c* may be formed, for example, through a sputtering process using a fine metal mask (FMM).

The anodes 120*a*, 120*b*, and 120*c* include the first anode 120*a*, the second anode 120*b*, and the third anode 120*c*. The first anode 120*a*, the second anode 120*b*, and the third anode 120*c* may be respectively positioned in the first emitting region E1, the second emitting region E2, and the third emitting region E3. The first anode 120*a*, the second anode 120*b*, and the third anode 120*c* may be made of the same material or may be made of different materials.

The pixel defining layer 130 is on the substrate 110 and the anodes 120*a*, 120*b*, and 120*c*. The pixel defining layer 130 exposes at least a portion of the anodes 120*a*, 120*b*, and 120*c*. For example, regions where the pixel defining layer 130 is not positioned may correspond to the emitting regions E1, E2, and E3. A region where the pixel defining layer 130 is positioned may correspond to the non-emitting regions NE.

The pixel defining layer 130 may be made of an insulating material. In one embodiment, the pixel defining layer 130 may be made of at least one organic material selected from the group including benzo cyclo butene (BCB), polyimide (PI), poly amide (PA), acrylic resin, and phenol resin, or may be made of an inorganic material such as silicon nitride.

The hole transfer layer 140 may be positioned on the anodes 120*a*, 120*b*, and 120*c* and the pixel defining layer 130. In one embodiment, the hole transfer layer 140 may be commonly formed over the entire surface of the substrate 110. The hole transfer layer 140 may be formed, for example, by a deposition process using an open mask. The hole transfer layer 140 may be selectively formed only on the emitting regions E1, E2, and E3. The hole transfer layer 140 may function to transfer holes from the anode to the organic light emitting layers 150*a*, 150*b*, and 150*c*.

The hole transfer layer 140 may include at least one of a hole injecting layer or a hole transport layer. The hole injecting layer may be in direct contact with at least one of the anodes 120*a*, 120*b*, and 120*c*, and the hole transport layer may be in direct contact with at least one of the organic light emitting layers 150*a*, 150*b*, and 150*c*.

The hole injecting layer may include a hole injecting material, e.g., phthalocyanine compounds including but not limited to copper phthalocyanine, TCTA or m-MTDATA of starburst-type amine derivatives, Pani/DBSA (Polyaniline/Dodecylbenzenesulfonic acid) or PEDOT/PSS (poly(3,4-ethylenedioxythiophene)/Poly(4-styrenesulfonate) that is conducting polymer, Pani/CSA(Polyaniline/Camphor sulfonic acid), or PANI/PSS(Polyaniline)/Poly (4-styrenesulfonate).

The hole transport layer may include a hole transport material, e.g., 1,3,5-tricarbazolylbenzene, 4,4'-biscarbazolylbiphenyl, polyvinylcarbazol, m-biscarbazolylphenyl, 4,4'-biscarbazolyl-2,2'-dimethylbiphenyl, 4,4',4"-tri(N-carbazolyl) triphenylamine, 1,3,5-tri (2-carbazolylphenyl)benzene, 1,3,5-tris (2-carbazolyl-5-methoxphenyl) benzene, bis (4-carbazolylphenyl)silane, N,N'-bis(3-methylphenyl)-N,N'-diphenyl-[1,1-biphenyl]-4,4' diamine (TDP), N,N'-di (naphthalene-1-il)-N,N'-diphenyl benzidine (NPD), N,N'-dephenyl-N,N'-bis(1-naphthyl)-(1,1'-biphenyl)-4,4'-diamine (NPB), poly(9,9-dioctylfluorene-co-N-(4-butylphenyl)diphenylamine) (TFB), or (poly(9,9-dioctylfluorene-co-bis-(4-butylphenyl-bis-N,N-phenyl-1,4-phenylenediamin) (PFB), but is not limited thereto.

The organic light emitting layers 150*a*, 150*b*, and 150*c* are on the hole transfer layer 140. The organic light emitting layers 150*a*, 150*b*, and 150*c* emit light of specific colors. For example, in the plurality of organic light emitting layers 150*a*, 150*b*, and 150*c*, holes and electrons provided from anodes 120*a*, 120*b*, and 120*c* and the cathode 170 recombine to form excitons. As the energy level of the excitons changes, light of specific colors (e.g., red, green, blue, yellow, white, etc.) are emitted.

The organic light emitting layers 150*a*, 150*b*, and 150*c* include the first organic light emitting layer 150*a*, the second organic light emitting layer 150*b*, and the third organic light emitting layer 150*c*. The first organic light emitting layer 150*a*, the second organic light emitting layer 150*b*, and the third organic light emitting layer 150*c* may be made of different materials. The first organic light emitting layer 150*a* may include a first emitting material that emits a first-color light, the second organic light emitting layer 150*b* may include a second emitting material that emits a second-color light that is different from the first color, and the third organic light emitting layer 150*c* may include a third emitting material that emits a third-color light that is different from the first color and the second color.

The first color, the second color, and the third color may be, for example, red, blue, and green respectively, or a different combination of colors including white. For example, the first organic light emitting layer 150*a*, the second organic light emitting layer 150*b*, and the third organic light emitting layer 150*c* may emit red light, blue light, and green light, respectively.

If the first organic light emitting layer 150*a* emits red light, the first organic light emitting layer 150*a* may be made of a high-molecular material, a low-molecular material, or a high/low-molecular mixed material which inherently emits red light. In one embodiment, the red organic light emitting layer may include a red host material and a red dopant material. The red host material may be, for example, at least one selected from the group including {Bis(2-(2-hydroxyphenyl)benzothiazolato) zinc (Zn(BTZ)2)} and {Bis-(2-methyl-8-quinolinolate)-4-(phenylphenolate)aluminium}, but is not limited thereto. The red dopant material may include, for example, PtOEP, Ir(piq)$_3$, Btp$_2$Ir(acac) or DCJTB.

If the second organic light emitting layer 150*b* emits blue light, the second organic light emitting layer 150*b* may be made of a high-molecular material, a low-molecular material, or a high/low-molecular mixed material which inherently emits blue light. In one embodiment, the blue organic light emitting layer may include a blue host material and a blue dopant material. The blue host material may be, for example, at least one selected from the group including anthracene derivatives and carbazole-based compound. The anthracene derivatives may be, for example, 9,10-(2-dinaphtyl)anthracene (AND). The carbazole-based compound may be, for example, 4,4'-(carbazole-9-il) biphenyl (CBP). The blue dopant material may include, for example, F$_2$Irpic, (F$_2$ppy)$_2$Ir(tmd), Ir(dfppz)$_3$, or ter-fluorene.

If the third organic light emitting layer 150*c* emits green light, the third organic light emitting layer 150*c* may be made of a high-molecular material, a low-molecular material, or a high/low-molecular mixed material which inherently emits green light. In one embodiment, the green organic light emitting layer may include a green host material and a green dopant material. The green host material may be, for example, at least one selected from the group including anthracene derivatives and carbazole-based compound. The anthracene derivatives may be, for example, 9,10-(2-dinaphtyl)anthracene (AND). The carbazole-based compound may be, for example, 4,4'-(carbazole-9-il) biphenyl (CBP). The green dopant material may include, for example, $Ir(ppy)_3$ (ppy=phenylpyridine), $Ir(ppy)_2(acac)$, $Ir(mpyp)_3$, or C545T.

The first organic light emitting layer 150a may be positioned on the first anode 120a in the first emitting region E1. In one embodiment, the first organic light emitting layer 150a may be positioned on the remaining region except for part of the first anode 120a in the first emitting region E1. For example, the first organic light emitting layer 150a may be positioned on an edge portion 20 of the first anode 120a that faces the second anode 120b, for example, on the remaining region except for the left edge portion. The first organic light emitting layer 150a may be positioned on the whole surface of the first anode 120a in the first emitting region E1.

The second organic light emitting layer 150b may be positioned on part of the first anode 120a in the first emitting region E1 and in the second emitting region E2. In one embodiment, the second organic light emitting layer 150b may be on the whole surface of the second anode 120b in the second emitting region E2. Further, the second organic light emitting layer 150b may be not only in the second emitting region E2, but also part of the first emitting region E1.

The part of the first emitting region E1 may correspond to an edge portion of the first anode 120a that faces the second anode 120b, for example, the left edge portion. In this case, the second organic light emitting layer 150b may be formed to extend from the upper portion of the second anode 120b to the upper portion of the edge portion 20 of the first anode 120a that faces the second anode 120b. For example, the second organic light emitting layer 150b may completely cover the pixel defining layer 130 that is between the first anode 120a and the second anode 120b.

The first organic light emitting layer 150a and the second organic light emitting layer 150b may not overlap each other. For example, the second organic light emitting layer 150b may be on part of the first anode 120a that is positioned in the first emitting region E1 and may be in the region except for the part of the first anode 120a. The first organic light emitting layer 150a and the second organic light emitting layer 150b may overlap each other in the first emitting region E1.

The first organic light emitting layer 150a may be in direct contact with the second organic light emitting layer 150b on the first anode 120a, that is positioned in the first emitting region E1. In one embodiment, the side surface of the first organic light emitting layer 150a may be in direct contact with the second organic light emitting layer 150b.

The third organic light emitting layer 150c may be on the third anode 120c that is positioned in the third emitting region E3. In one embodiment, the third organic light emitting layer 150c may be on the whole surface of the third anode 120c that is positioned in the third emitting region E3.

Although the first organic light emitting layer 150a is positioned on most of the region of the first anode 120a in the first emitting region E1, the second organic light emitting layer 150b may be on a partial region of the first anode 120a in the first emitting region E1. On the other hand, the second organic light emitting layer 150b may be on the whole surface of the second anode 120b in the second emitting region E2. The third organic light emitting layer 150c may be on the whole surface of the third anode 120c in the third emitting region E3.

The auxiliary layers 150a' and 150c' may be between at least a part of the organic light emitting layers 150a, 150b, and 150c and the hole transfer layer 140. The auxiliary layers 150a' and 150c' may function to adjust a resonance distance in each pixel (or sub-pixel). For example, the auxiliary layers 150a1 and 150c' may function to heighten the color purity and light emitting efficiency of light emitted from the organic light emitting layers 150a, 150b, and 150c. The auxiliary layers 150a' and 150c' may include the first auxiliary layer 150a' and the second auxiliary layer 150c'.

The first auxiliary layer 150a' may be between the first organic light emitting layer 150a and the hole transfer layer 140. The first auxiliary layer 150a' may completely overlap the first organic light emitting layer 150a. In one embodiment, the first auxiliary layer 150a' may be successively formed together with the first organic light emitting layer 150a in the same chamber. The first auxiliary layer 150a' may function to adjust the resonance distance of the first-color light emitted from the first organic light emitting layer 150a. For example, the first auxiliary layer 150a' may adjust the distance between the first anode 120a and the cathode 170 in the first emitting region E1. In one embodiment, the first auxiliary layer 150a' may include, for example, at least one selected from the group including silicon nitride ($SiN_x$), silicon oxide ($SiO_2$), and silicon oxynitride ($SiO_N$).

The second auxiliary layer 150c' may be between the third organic light emitting layer 150c and the hole transfer layer 140. The second auxiliary layer 150c' may completely overlap the third organic light emitting layer 150c. In one embodiment, the second auxiliary layer 150c' may be successively formed together with the third organic light emitting layer 150c in the same chamber. The second auxiliary layer 150c' may function to adjust the resonance distance of the third-color light emitted from the third organic light emitting layer 150c. For example, the second auxiliary layer 150c' may adjust the distance between the third anode 120c and the cathode 170 in the third emitting region E3.

The thickness of the second auxiliary layer 150c' may be different from (e.g., thinner than) the thickness of the first auxiliary layer 150a'. Further, the second auxiliary layer 150c' may be made of the same or a different material as the material of the first auxiliary layer 150a'. The second auxiliary layer 150c' may include, for example, at least one selected from the group including silicon nitride ($SiN_x$), silicon oxide ($SiO_2$), and silicon oxynitride ($SiO_N$).

The electron transfer layer 160 may be positioned on the organic light emitting layers 150a, 150b, and 150c and the pixel defining layer 130. In one embodiment, the electron transfer layer 160 may be commonly formed on the whole surface of the substrate 110. The electron transfer layer 160 may be formed, for example, by a deposition process using an open mask. In one embodiment, the electron transfer layer 160 may be selectively formed only on the emitting regions E1, E2, and E3. The electron transfer layer 160 may function to transfer electrons from the cathode 170 to the organic light emitting layers 150a, 150b, and 150c.

The electron transfer layer 160 may include at least one of an electron injecting layer or an electron transport layer. The electron injecting layer may be in direct contact with the cathode 170. The electron transport layer may be in direct contact with the organic light emitting layers 150a, 150b, and 150c.

The electron injecting layer may include an electron injecting material. The electron injecting material may include, for example, at least one of LiF, LiQ, or NaQ. As another example, the electron injecting material may include NaCl, CsF, Li$_2$O, or BaO.

The electron transport layer may include an electron transport material. The electron transport material may include, for example, at least one of a pyrene series material, a triazine series material, or an anthracene series material. As another example, the electron transport material may include materials such as but not limited to quinoline derivatives, and particularly, tris(8-quinolinolate)aluminum (Alq3), TAZ, and Balq.

The cathode 170 may be positioned on the electron transfer layer 160. In one embodiment, the cathode 170 may be commonly formed on the whole surface of the substrate 110. The cathode 170 may be formed, for example, by a deposition process using an open mask. In one embodiment, the cathode 170 may be selectively formed only on the emitting regions E1, E2, and E3. The cathode 170 may function to provide electrons to the organic light emitting layers 150*a*, 150*b*, and 150*c*.

Figure 3:
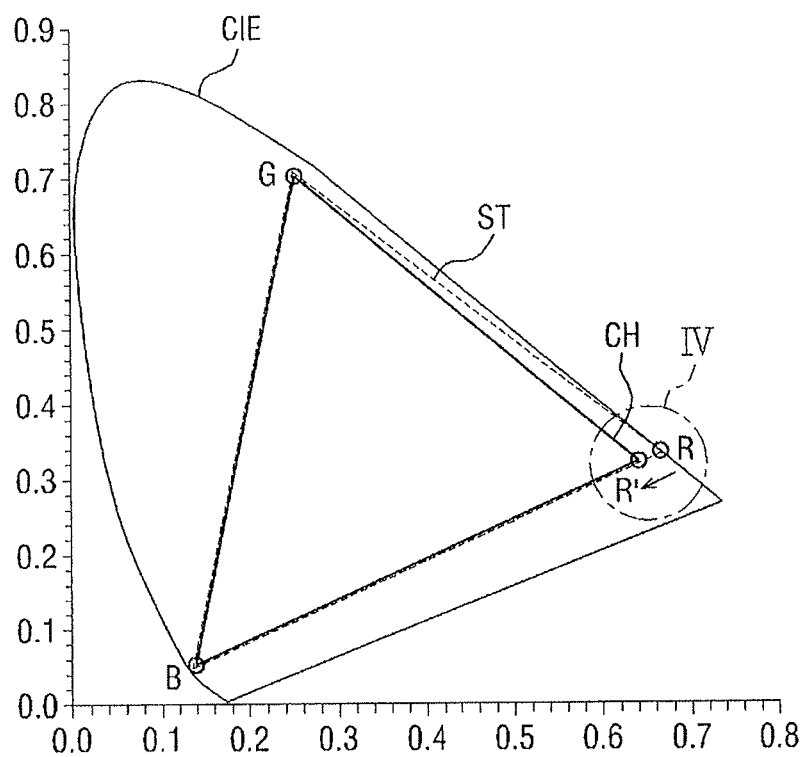
FIG. 3 illustrates an example of a color coordinate system for color correction.
Figure 4:
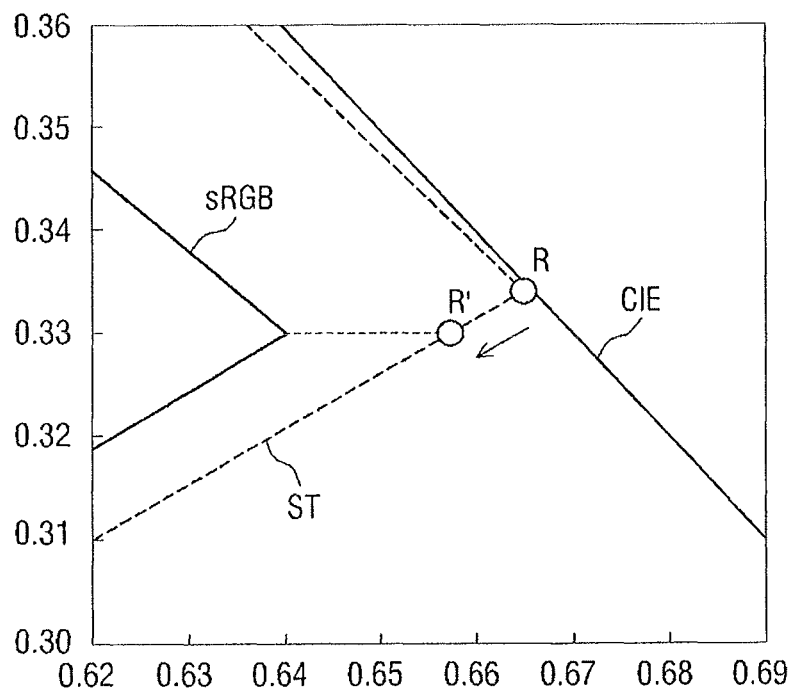
FIG. 4 illustrates an example of a color coordinate system including portion IV in FIG. 3.

FIGS. 3 and 4 illustrate an example of color correction effects of the organic light emitting display device 100. More specifically, FIG. 3 illustrates an embodiment of a color coordinate system explaining color correction effects of an organic light emitting display device, which, for example, may correspond to device 100 in FIG. 1. FIG. 4 illustrates an example of a color coordinate system with portion IV in FIG. 3 enlarged. Moreover, FIGS. 3 and 4 illustrate the color coordinates as seen from a front perspective of the organic light emitting display device 100.

First, referring to FIG. 3, in a CIE color coordinate system: R corresponds to the color coordinates of light of a first color (e.g., red) emitted from the first organic light emitting layer 150*a*; B corresponds to the color coordinates of light of a second color (e.g., blue) emitted from the second organic light emitting layer 150*b*; and C corresponds to the color coordinates of light of a third color (e.g., green) emitted from the third organic light emitting layer 150*c*. The R, G, and B color coordinates form a standard triangle (ST).

If only the first organic light emitting layer 150*a* is positioned on the first emitting region E1, only the second organic light emitting layer 150*b* is positioned on the second emitting region E2, and only the third organic light emitting layer 150*c* is positioned on the third emitting region E3, the organic light emitting display device 100 emits light having color coordinates in the standard triangle ST.

If the first organic light emitting layer 150*a* is unable to emit high-purity red light (e.g., if the y color coordinates of light emitted from the first organic light emitting layer 150*a* are larger than the y color coordinates of high-purity red light), the organic light emitting display device 100 may not properly express high-purity red color. In this case, color correction may be performed so that the organic light emitting display device 100 expresses high-purity red color. As illustrated in FIGS. 1 and 2, color correction may be performed by arranging not only the first organic light emitting layer 150*a* that emits the red light, but also the second organic light emitting layer 150*b* that emits the blue light.

Referring to FIGS. 3 and 4, as the ratio of the area of the second organic light emitting layer 150*b* to the area of the first organic light emitting layer 150*a* in the first emitting region E1 increases, the color coordinates R may move in the direction of an arrow on one side of the standard triangle ST. In one embodiment, the color coordinates of light emitted from the first emitting region E1 of the organic light emitting display device 100 of FIG. 1 may be set to R'.

For example, through proper adjustment of the area of the second organic light emitting layer 150*b* in the first emitting region E1, they color coordinates of the color coordinates R' of light emitted from the first emitting region E1 may equally match the y color coordinates of the red color coordinates of the sRGB color coordinate system. In this case, high-purity red light may be emitted from the first emitting region E1. In this case, R', B, and G form a changed triangle CH, and the organic light emitting display device 100 of FIG. 1 may emit light having the color coordinates in the changed triangle CH.

Figure 5:
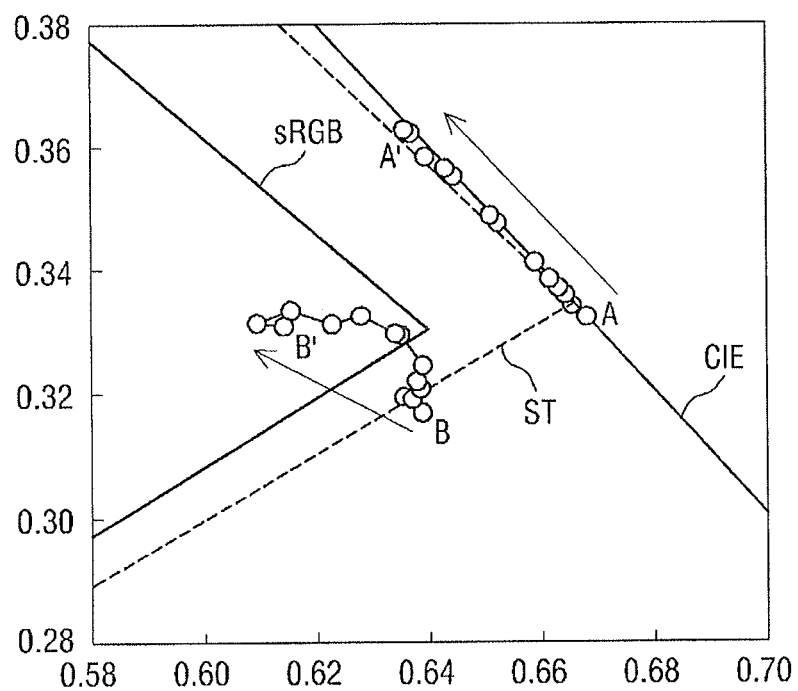
FIG. 5 illustrates an example of a color coordinate system with a side visibility improvement effect.
Figure 6:
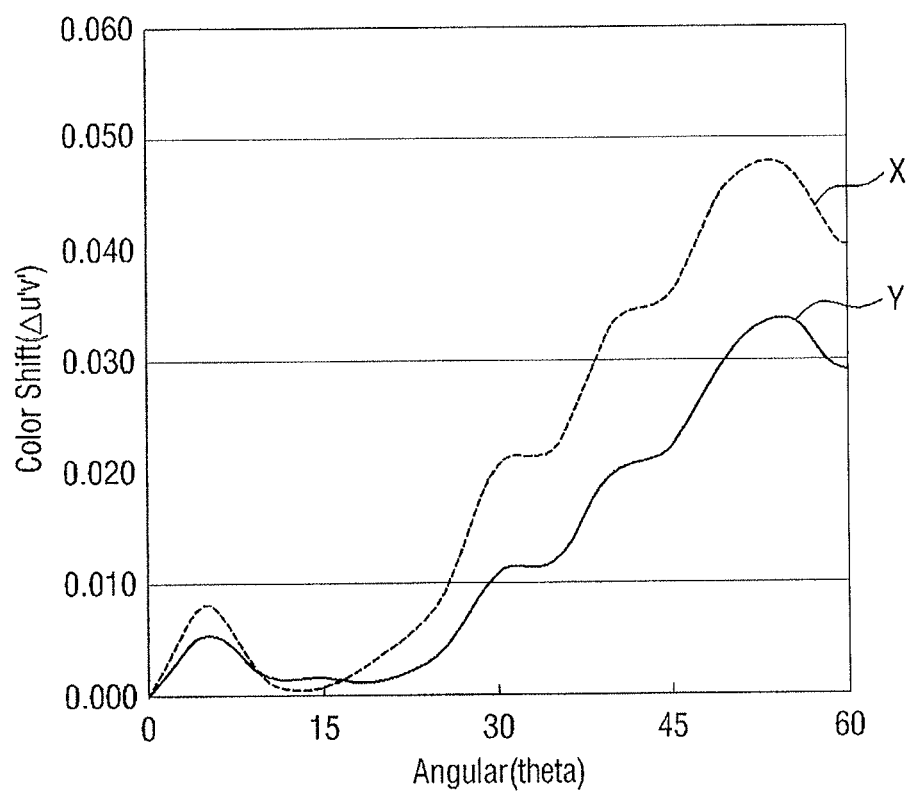
FIG. 6 illustrates an example of color shift curves.

FIGS. 5 and 6 illustrate an example of side visibility improvement effects of the organic light emitting display device 100 according to one embodiment. FIG. 5 illustrates an example of a color coordinate system explaining a side visibility improvement effect of the organic light emitting display device 100. FIG. 6 is a graph in which line A-A' and line B-B' of the color coordinate system are converted to color shift curves according to their angles.

First, referring to FIG. 5, A indicates the color coordinates when light emitted from the first emitting region E1 is seen from a front surface of the organic light emitting display device 100 (e.g., the direction of a normal line of the display surface of the organic light emitting display device 100) in the case where only the first organic light emitting layer 150*a* is positioned on the first emitting region E1. A' indicates color coordinates when light emitted from the first emitting region E1 is seen from a side surface of the organic light emitting display device 100 (e.g., the direction that is oriented 60 degrees from the normal line of the display surface of the organic light emitting display device 100) in the case where only the first organic light emitting layer 150*a* is positioned on the first emitting region E1. As described above, if the organic light emitting display device 100 is seen as moving from the front surface to the side surface of the organic light emitting display device 100, the color coordinates of the red light, and in particular, the y color coordinates, may abruptly change in the direction of the arrow.

B indicates color coordinates when light emitted from the first emitting region E1 is seen from the front surface of the organic light emitting display device 100 (e.g., the direction of the normal line of the display surface of the organic light emitting display device 100) in the case where not only the first organic light emitting layer 150*a*, but also the second organic light emitting layer 150*b*, is positioned on the first emitting region E1. B' indicates color coordinates when light emitted from the first emitting region E1 is seen from the side surface of the organic light emitting display device 100 (e.g., the direction oriented 60 degrees from the normal line of the display surface of the organic light emitting display device 100) in the case where not only the first organic light emitting layer 150*a*, but also the second organic emitting layer 150*b*, is positioned on the first emitting region E1.

As described above, if the organic light emitting display device 100 is seen as moving from the front surface to the side surface of the organic light emitting display device 100, the color coordinates of the red light may change in the direction of the arrow, but the variation of the y color coordinates is not relatively large. A main factor that influences visibility is the y color coordinates. If two lights are combined in the first emitting region E1 to form mixed light, the side visibility of the mixed light becomes higher than the side visibility of non-mixed light.

Referring to FIG. 6, curve X corresponds to line A-A' in FIG. 5 for conversion of a color shift curve according to the angle thereof. Curve Y corresponds to line B-B' in FIG. 5 for conversion to a color shift curve according to the angle thereof. As illustrated in FIG. 6, as the angle at which the organic light emitting display device 100 is seen increases, curve Y (e.g., the color shift of the mixed light) decreases and becomes smaller than the color shift of the non-mixed light. Thus, by arranging not only the first organic light emitting layer 150a, but also the second organic light emitting layer 150b, in the first emitting region E1, the visibility of red light is improved.

Figure 7:
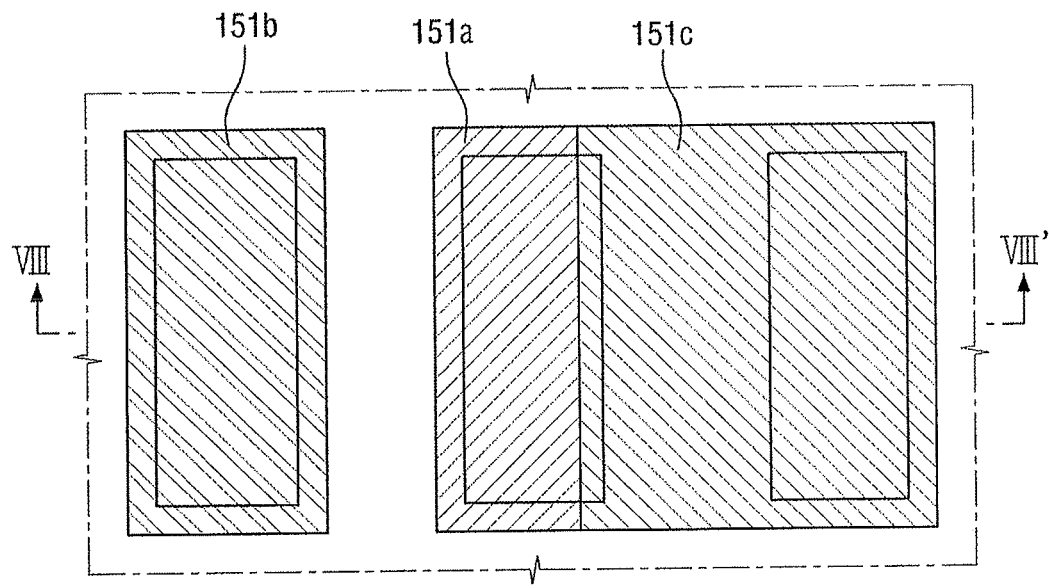
FIG. 7 illustrates another embodiment of an organic light emitting display.
Figure 8:
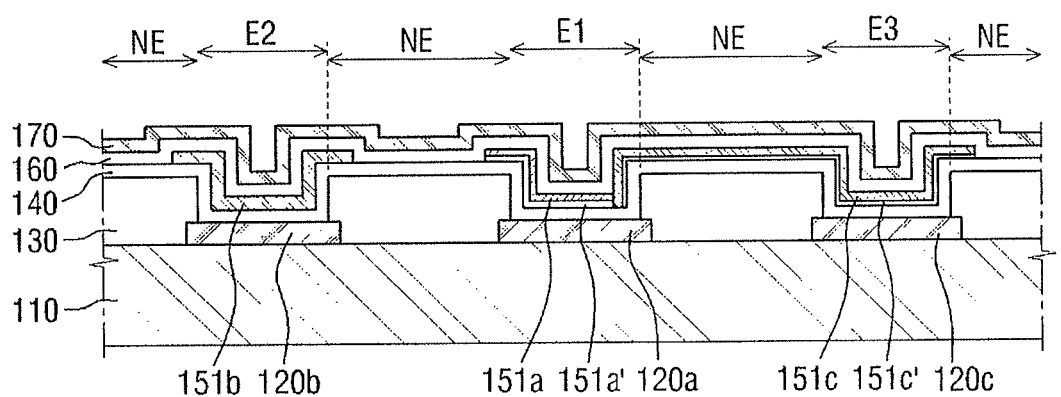
FIG. 8 illustrates a view along section line VIII-VIII' in FIG. 7.

FIG. 7 illustrates another embodiment of an organic light emitting display 101, and FIG. 8 is a cross-sectional view taken along line VIII-VIII' in FIG. 7. Referring to FIGS. 7 and 8, a first organic light emitting layer 151a, a second organic light emitting layer 151b, a third organic light emitting layer 151c, a first auxiliary layer 151a', and a second auxiliary layer 151c' may be made of the same materials as the first organic light emitting layer 150a, the second organic light emitting layer 150b, the third organic light emitting layer 150c, the first auxiliary layer 150a', and the second auxiliary layer 150c', respectively.

However, the first organic light emitting layer 151a may be positioned on a remaining area except for part of the first anode 120a on the first emitting layer. The second organic light emitting layer 151b may be positioned on an entire surface of the second anode 120b on the second emitting region E2, and the third organic light emitting layer 151c may be positioned on part of the first anode 120a on the first emitting region E1 and on the entire surface of the third anode 120c on the third light emitting region E3.

Here, the part of the first emitting region E1 may correspond to an edge portion of the first anode 120a that faces the third anode 120c, e.g., the right edge portion. In this case, the third organic light emitting layer 151c may extend from the upper portion of the third anode 120c to the upper edge portion of the first anode 120a that faces the third anode 120c. Further, the first auxiliary layer 151a' may completely overlap the third organic light emitting layer 151c, and may be formed on the lower portion of the third organic light emitting layer 151c.

Figure 9:
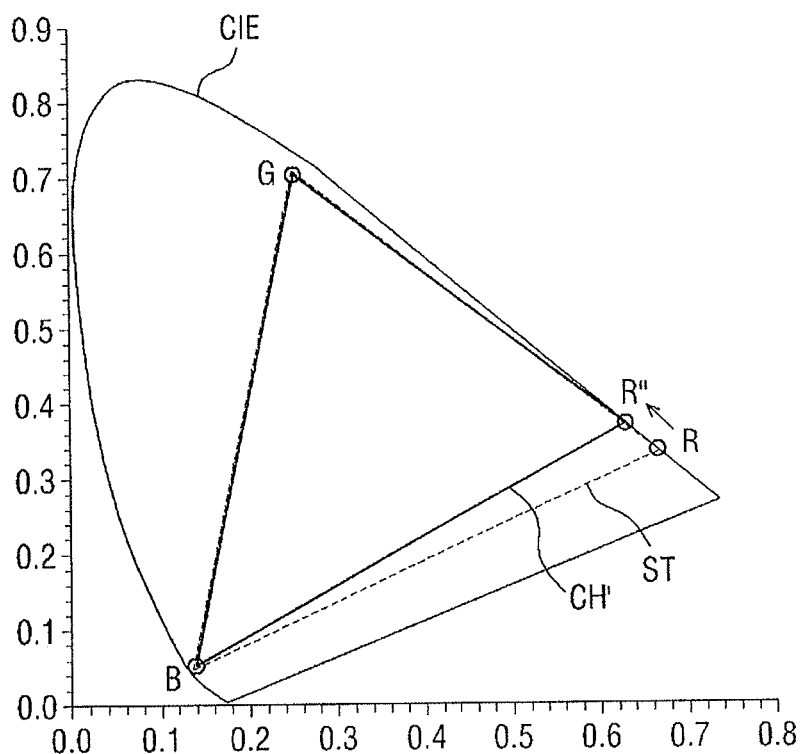
FIG. 9 illustrates another example of a color coordinate system for color correction.

FIG. 9 illustrates an example of a color coordinate system explaining color correction effects of the organic light emitting display device in FIG. 7. Referring to FIG. 9, as a ratio of the area of the third organic light emitting layer 151c to the area of the first organic light emitting layer 151a in the first emitting region E1 increases, the color coordinates R may move in the direction of an arrow along one side of the standard triangle ST. In one embodiment, the color coordinates of light emitted from the first emitting region E1 of the organic light emitting display device 101 in FIG. 7 may be R". In this case, R", B, and G form a changed triangle CH', and the organic light emitting display device 101 in FIG. 7 may emit the light having color coordinates in the changed triangle CH'.

Figure 10:
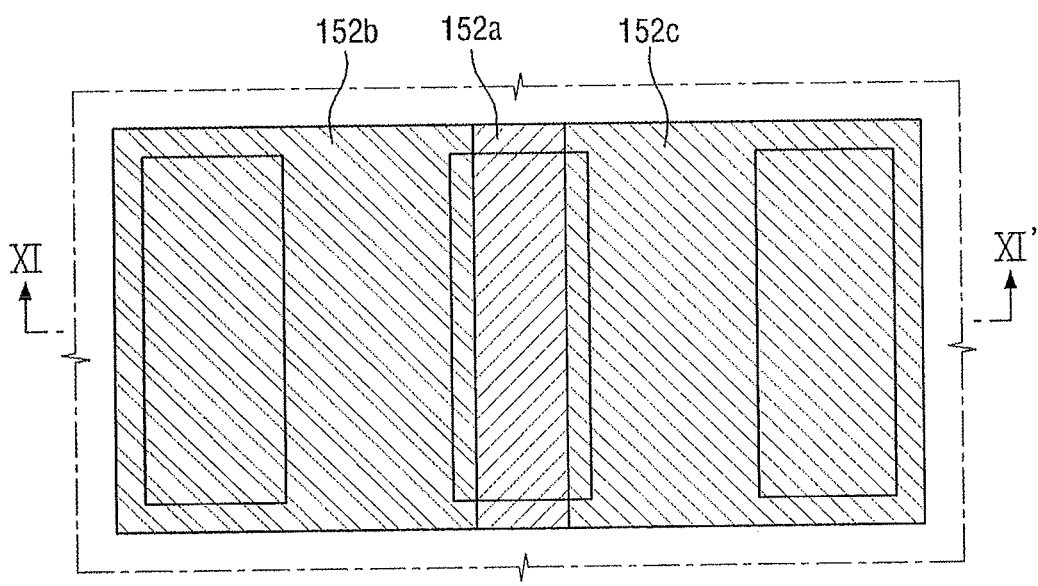
FIG. 10 illustrates another embodiment of an organic light emitting display.
Figure 11:
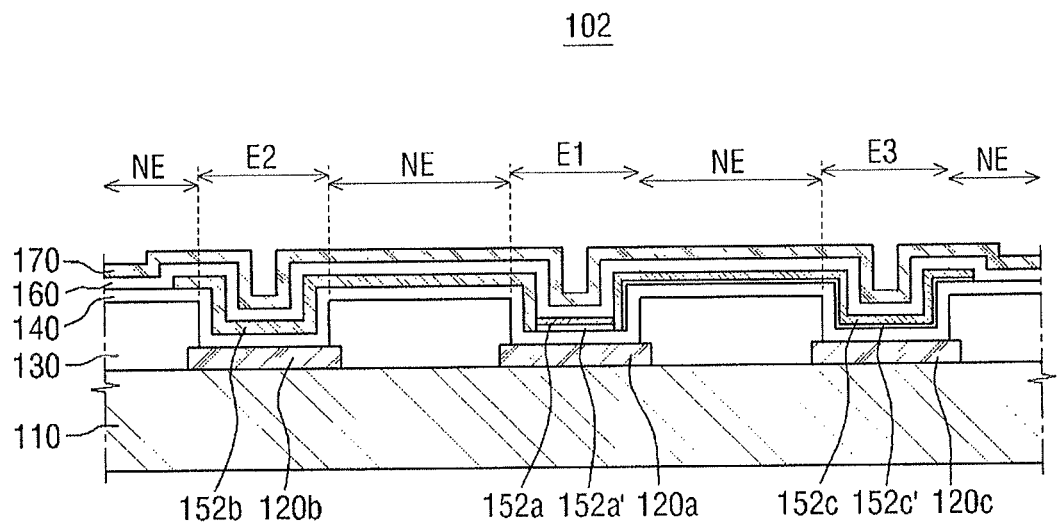
FIG. 11 illustrates a view along section line XI-XI' in FIG. 10.

FIG. 10 illustrates another embodiment of an organic light emitting display device 102, and FIG. 11 is a view taken along section line XI-XI' in FIG. 10. Referring to FIGS. 10 and 11, a first organic light emitting layer 152a, a second organic light emitting layer 152b, a third organic light emitting layer 152c, a first auxiliary layer 152a', and a second auxiliary layer 152c' may be made of the same materials as the first organic light emitting layer 150a, the second organic light emitting layer 150b, the third organic light emitting layer 150c, the first auxiliary layer 150a', and the second auxiliary layer 150c', respectively.

However, the first organic light emitting layer 152a may be positioned on the center portion of the first anode 120a positioned on the first emitting layer. The second organic light emitting layer 152b may be positioned on part of the first anode 120a on the first emitting region E1 and on the entire surface of the second anode 120b on the second emitting region E2. The third organic light emitting layer 152c may be positioned on another part of the first anode 120a on the first emitting region E1 and on the entire surface of the third anode 120c on the third light emitting region E3.

Here, the part of the first emitting region E1 may correspond to an edge portion of the first anode 120a that faces the second anode 120b, e.g., the left edge portion. The other part of the first light emitting region E1 may correspond to an edge portion of the first anode 120a that faces the third anode 120c, e.g., the right edge portion. In this case, the second organic light emitting layer 152b may extend from the upper portion of the second anode 120b to the upper edge portion of the first anode 120a that faces the second anode 120b. The third organic light emitting layer 152c may extend from the upper portion of the third anode 120c to the upper edge portion of the first anode 120a that faces the third anode 120c.

Further, the first auxiliary layer 152a' may completely overlap the first organic light emitting layer 152a, and may be formed on the lower portion of the first organic light emitting layer 152a. The second auxiliary layer 152a' may completely overlap the third organic light emitting layer 152c, and may be formed on the lower portion of the third organic light emitting layer 152c. Further, the first organic light emitting layer 152a may not overlap the second organic light emitting layer 152b and the third organic light emitting layer 152c. Further, the first organic light emitting layer 152a may directly contact the second organic light emitting layer 152b and the third organic light emitting layer 152c on the first anode 120a.

Figure 12:
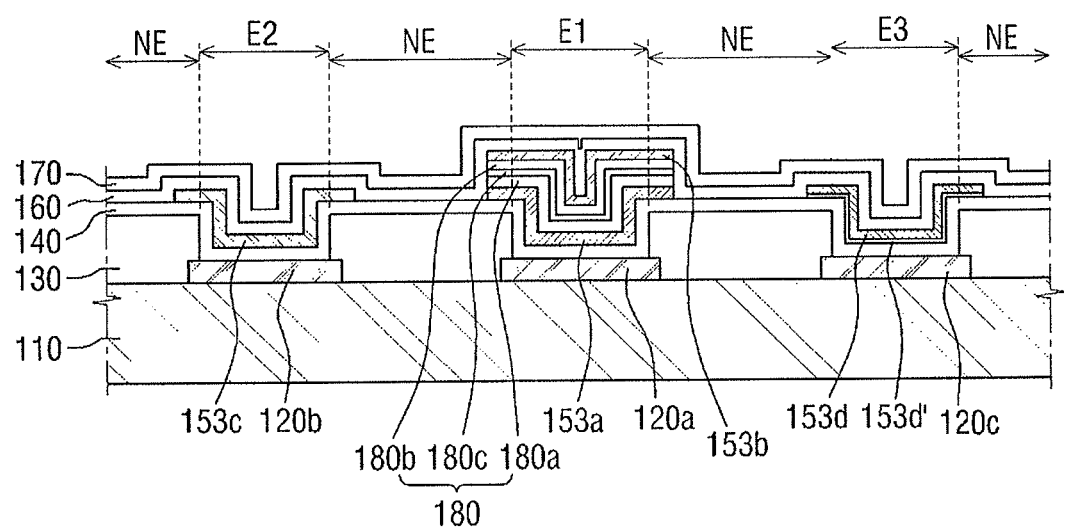
FIGS. 12 and 13 illustrate another embodiment of an organic light emitting display device.

FIG. 12 illustrates another embodiment of an organic light emitting display device 103. Referring to FIG. 12, the first organic light emitting layer 153a may be made of the same material as the first organic light emitting layer 150a as described above. For example, the first organic light emitting layer 153a includes a first emitting material that emits light of a first color, e.g., red. The first organic light emitting layer 153a may be positioned on the entire surface of the first anode 120a on the first emitting region E1.

A second organic light emitting layer 153b may be positioned on the first organic light emitting layer 153a. The second organic light emitting layer 153b may include a second light emitting material that emits light of a second color (e.g., blue), and/or a third organic light emitting material that emits light of a third color, e.g., green.

An intermediate layer 180 may be between the first organic light emitting layer 153a and the second organic light emitting layer 153b. The intermediate layer 180 may include a charge generating layer 180c between a sub-electron transfer layer 180a, a sub-hole transfer layer 180b. The sub-electron transfer layer 180a is adjacent to the first organic light emitting layer 153a, and may be made of the same material as the electron transfer layer 160. The sub-hole transfer layer 180b is adjacent to the second organic layer 153b, and is made of the same material as the hole transfer layer 140. The charge generating layer 180c generates electrons and holes.

The electrons generated from the charge generating layer 180c may be transferred to the first organic light emitting layer 153a through the sub-electron transfer layer 180a. The holes generated from the charge generating layer 180c may be transferred to the second organic light emitting layer 153b through the sub-hole transfer layer 180b. The charge generating layer 180c may prevent the electrons and holes from moving in opposite directions.

In the organic light emitting display device 103 according to another embodiment, the first auxiliary layer 150a' may be omitted. In this case, the function of the first auxiliary layer 150a' as described above (i.e., the resonance distance adjustment function) may be performed by the intermediate layer 180.

The third organic light emitting layer 153c may be made of the same material as the second organic light emitting layer 153b as described above. That is, the third organic light emitting layer 153c may include a second light emitting material that emits light of the second color. The third organic light emitting layer 153c may be on the entire surface of the second anode 120b on the second emitting region E2.

A fourth organic light emitting layer 153d may be made of the same material as the third organic light emitting layer 153c as described above. That is, the fourth organic light emitting layer 153d may include a third light emitting material that emits light of the third color. The fourth organic light emitting layer 153d may be on the entire surface of the third anode 120c on the third emitting region E3.

The second auxiliary layer 153d' may be made of the same material as the second auxiliary layer 150c' as described above. The second auxiliary layer 153d' may completely overlap the fourth organic light emitting layer 153d on the lower portion of the fourth organic light emitting layer 153d.

Because the first organic light emitting layer 153a and the second organic light emitting layer 153b overlap each other in the first emitting region E1, the color of light emitted from the first emitting region E1 may be corrected.

Figure 13:
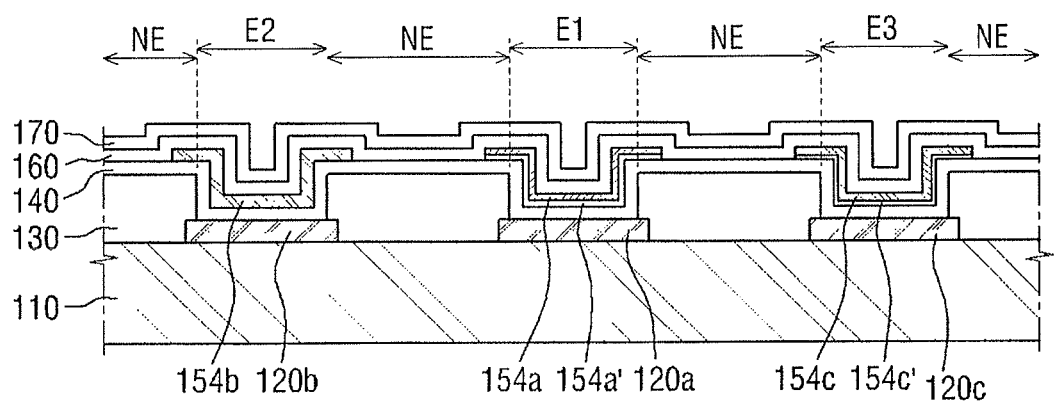

FIG. 13 is a cross-section view of another embodiment of an organic light emitting display device 104. Referring to FIG. 13, the first organic light emitting layer 154a may include a second emitting material and/or a third emitting material in addition to the first emitting material. For example, the first organic light emitting layer 154a may include a mixture of a plurality of emitting materials. The first organic light emitting layer 154a may be positioned on the entire surface of the first anode 120a in the first emitting region E1.

The first auxiliary layer 154a' may be made of the same material as the first auxiliary layer 150a' as described above. The first auxiliary layer 154a' may be formed to completely overlap the first organic light emitting layer on the lower portion of the first organic light emitting layer.

The second organic light emitting layer 154b may be made of the same material as the second organic light emitting layer 150b as described above. For example, the second organic light emitting layer 154b may include a second light emitting material. The second organic light emitting layer 154b may be positioned on the entire surface of the second anode 120b in the second emitting region E2.

The third organic light emitting layer 154c may be made of the same material as the third organic light emitting layer 150c as described above. For example, the third organic light emitting layer 154c may include a third light emitting material that emits the third-color light. The third organic light emitting layer 154c may on the entire surface of the third anode 120c on the third emitting region E3.

The second auxiliary layer 154c' may be made of the same material as the second auxiliary layer 150c' as described above. The second auxiliary layer 154c' may be formed to completely overlap the third organic light emitting layer 154c on the lower portion of the third organic light emitting layer 154c.

As described above, because the first organic light emitting layer 154a includes the second emitting material and/or the third emitting material in addition to the first emitting material, the color of light emitted from the first emitting region E1 may be corrected.

By way of summation and review, in one type of organic light emitting display device, a plurality of emitting layers are included to emit light of different colors. For example, a first emitting layer emits light of a first color, a second emitting layer emits light of a second color, and a third emitting layer emits light of a third color. A particular color is emitted by combining the light of the first to third colors.

However, if at least any one of the first to third emitting layers does not properly emit light of a specific color, the color expression of the organic light emitting display device may deteriorate. For example, if the first emitting layer in a red pixel emits low-purity red light (e.g., orange light) rather than high-purity red light, the organic light emitting display device that includes the first emitting layer may not properly display the red color.

Further, the low-purity red light emitted from the first emitting layer may have low side visibility. Accordingly, when a display surface of the organic light emitting display device is seen from the side of the organic light emitting display device, the purity of the red light emitted from the first emitting layer may be further lowered.

In accordance with one or more of the aforementioned embodiments, an organic light emitting display device is provided which has improved color expression and side visibility.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. An organic light emitting display device, comprising:
   a substrate having a first emitting region adjacent to a second emitting region;
   a first anode in the first emitting region;
   a first organic light emitting layer on the first anode and including a first emitting material to emit a first color;
   a second organic light emitting layer on the first organic light emitting layer and including a second emitting material to emit light of a second color different from the first color;
   a charge generation layer between the first organic light emitting layer and the second organic light emitting layer;
   a second anode in the second emitting region; and
   a third organic light emitting layer on the second anode and including the second emitting material.

2. The device as claimed in claim 1, wherein the first color is red and wherein the second color is green or blue.

3. The device as claimed in claim 1, wherein:
   the second organic light emitting layer includes a third emitting material to emit light of a third color different from the first color and the second color, the substrate includes a third emitting region on another side of the first emitting region, and the organic light emitting display device includes:

a third anode in the third emitting region; and a fourth organic light emitting layer on the third anode and including the third emitting material.

4. The device as claimed in claim 1, further comprising:

a cathode over an entire surface of the substrate and facing the first anode and the second anode, wherein the first organic light emitting layer and the second organic light emitting layer are between the cathode and the first and second anodes.

5. The device as claimed in claim 1, further comprising:

a hole transfer layer between the second organic light emitting layer and the charge generation layer; and an electron transfer layer between the first organic light emitting layer and the charge generation layer.

\* \* \* \* \*